United States Patent [19]
Cath et al.

[11] 3,979,642
[45] Sept. 7, 1976

[54] ELECTRONIC PROTECTIVE CIRCUIT

[75] Inventors: Pieter G. Cath, Cleveland; Robert J. Erdman, Twinsburg, both of Ohio

[73] Assignee: Keithley Instruments, Inc., Hudson, Ohio

[22] Filed: Sept. 20, 1974

[21] Appl. No.: 507,674

Related U.S. Application Data

[62] Division of Ser. No. 428,744, Dec. 27, 1973, Pat. No. 3,875,506.

[52] U.S. Cl. .................................... 317/16; 317/31; 323/9
[51] Int. Cl.² ............................................ H02H 3/00
[58] Field of Search ................ 317/20, 31, 33 R, 16; 323/9

[56] References Cited
UNITED STATES PATENTS

| | | | |
|---|---|---|---|
| 3,183,446 | 5/1965 | Richman | 324/110 |
| 3,526,810 | 9/1970 | Williams | 324/110 |
| 3,633,093 | 1/1972 | Templeton, Jr. et al. | 317/16 X |
| 3,760,228 | 9/1973 | Uchida | 317/33 R |
| 3,760,284 | 9/1973 | Matejka | 323/9 UX |

*Primary Examiner*—Harry Moose

[57] ABSTRACT

Electronic protective circuitry for protecting an electrical circuit, such as a constant current source circuit, from damage due to an overvoltage applied to the circuit. The protective circuit employs circuitry for limiting the magnitude of the voltage across a first portion of the circuit, such as an amplifier output circuit, so that the voltage thereacross is limited to a given maximum voltage level. A current limiter is connected in series between the first portion and second portion for limiting the magnitude of current flowing through the circuitry to a given maximum current level. Essentially all of the overvoltage is applied across the current limiter. The protective circuit is particularly applicable for protecting an amplifier from damage due to an overvoltage applied to its output circuit, as well as for protecting a resistor connected in series with the output circuit of the amplifier.

13 Claims, 4 Drawing Figures

ELECTRONIC PROTECTIVE CIRCUIT

This is a division, of application Ser. No. 428,744 filed Dec. 27, 1973, now U.S. Pat. No. 3,875,506.

This invention relates to the art of electrical protective devices and, more particularly, to an improved electronic protective circuit particularly applicable for protecting an amplifier, and the like, from damage due to an overvoltage applied to its output circuit or to protecting an electrical component, such as a resistor, from damage due to application of an overvoltage thereacross.

Although the invention will be particularly described with respect to protecting a constant current source circuit used in conjunction with measuring the resistance value of an unknown resistor, it is to be appreciated the invention has other applications and may be applied wherever the output circuit of an amplifier, or the like, would be provided with a fuse or circuit breaker or a large resistor to protect the amplifier or its output resistor from damage due to an overvoltage condition.

A specific application of the present invention is in conjunction with circuitry used for accurately measuring the resistance of an unknown resistor. Conventionally, an unknown resistor whose resistance is to be measured in connected across a pair of input terminals which, in turn, are connected to the input of an operational amplifier circuit. A current source serves to provide constant current through the unknown resistor to develop a voltage thereacross. The amplifier circuit, which has a high input impedance relative to the unknown resistor, serves to amplify the voltage developed across the unknown resistor. A measuring circuit serves to provide an output indication as to the value of the resistance of the unknown resistor dependent upon the voltage developed thereacross. The constant current source may include circuitry for developing a constant voltage across a known resistor so that a constant current flows through the known resistor, which is connected in series with the unknown resistor. In operation, an unusually high voltage may accidentally, or by circuit malfunction, be placed across the input terminals to the amplifier. An unusually high voltage may, for example, be a voltage of 5 volts to hundreds of volts, A.C. or D.C. This voltage will be placed directly across the constant current circuit and, unless protective devices are employed, the constant current circuitry may be destroyed.

It has been known to use circuit breakers and fuses to prevent destruction of electrical components, however, an overvoltage condition may permanently render the circuitry inoperative until a blown fuse is replaced, or the circuit breaker is reset.

It is therefore an object of the invention to provide an electronic protective circuit for protecting a constant current source circuit for a resistance measuring circuit against overvoltage conditions which would tend to destroy the constant current source circuit.

Another application of the invention relates to protection of an amplifier against damage when an overvoltage is applied to its output circuit. Thus, for example, an amplifier may be employed having a suitable feedback network for amplifying a voltage signal, which may be representative of an unknown value, and the amplified signal is then applied to a suitable readout circuit, such as a voltmeter. If, through malfunction or accident, or the like, an overvoltage is applied to the output circuit of the amplifier, the amplifier components may be destroyed. Protection against such an overvoltage condition is typically provided with a fuse or circuit breaker or a resistor or protective diodes in the output circuit. However, such protective devices suffer from the disadvantages in that fuses and circuit breakers must be replaced or reactivated and resistors or diodes may adversely effect the normal operation of the amplifier or be destroyed by the overvoltage.

Consequently, it is a specific object of the present invention to provide an electronic protective circuit in the output circuit of such an amplifier to protect the amplifier from damage due to an overvoltage applied to its output circuit.

In accordance with the present invention the electronic protector circuit serves to protect an electrical circuit which has a first portion, such as an amplifier, and a second portion, such as a resistor in the amplifier's output circuit or a terminal, and which portions are connected in series. When an overvoltage is applied across the series circuit the magnitude of the voltage developed across the first circuit portion is limited to a given maximum voltage level. Consequently, essentially all of the overvoltage is applied across the second circuit portion. The current flowing through the series circuit is limited in magnitude to a given maximum current level.

In accordance with a more limited aspect of the present invention, current limiting is accomplished with the use of a semiconductor having a pair of electrodes which are connected in series with the series circuit together with circuit means for limiting the magnitude of current flow through the semiconductor during an overvoltage condition to thereby prevent the current flowing through the series circuit from exceeding a given maximum current level.

In accordance with a still further aspect of the present invention, the circuit to be protected includes an amplifier having its output circuit connected in series with a known resistor, and the protective circuit serves to protect the amplifier from damage when an overvoltage is applied across the series circuit and to protect the resistor from damage by limiting the current flow through the series circuit.

The foregoing and other objects and advantages of the invention will become more readily apparent from the following description of the preferred embodiments of the invention as taken in conjunction with the accompanying drawing which are a part hereof and wherein.

Figure 1:
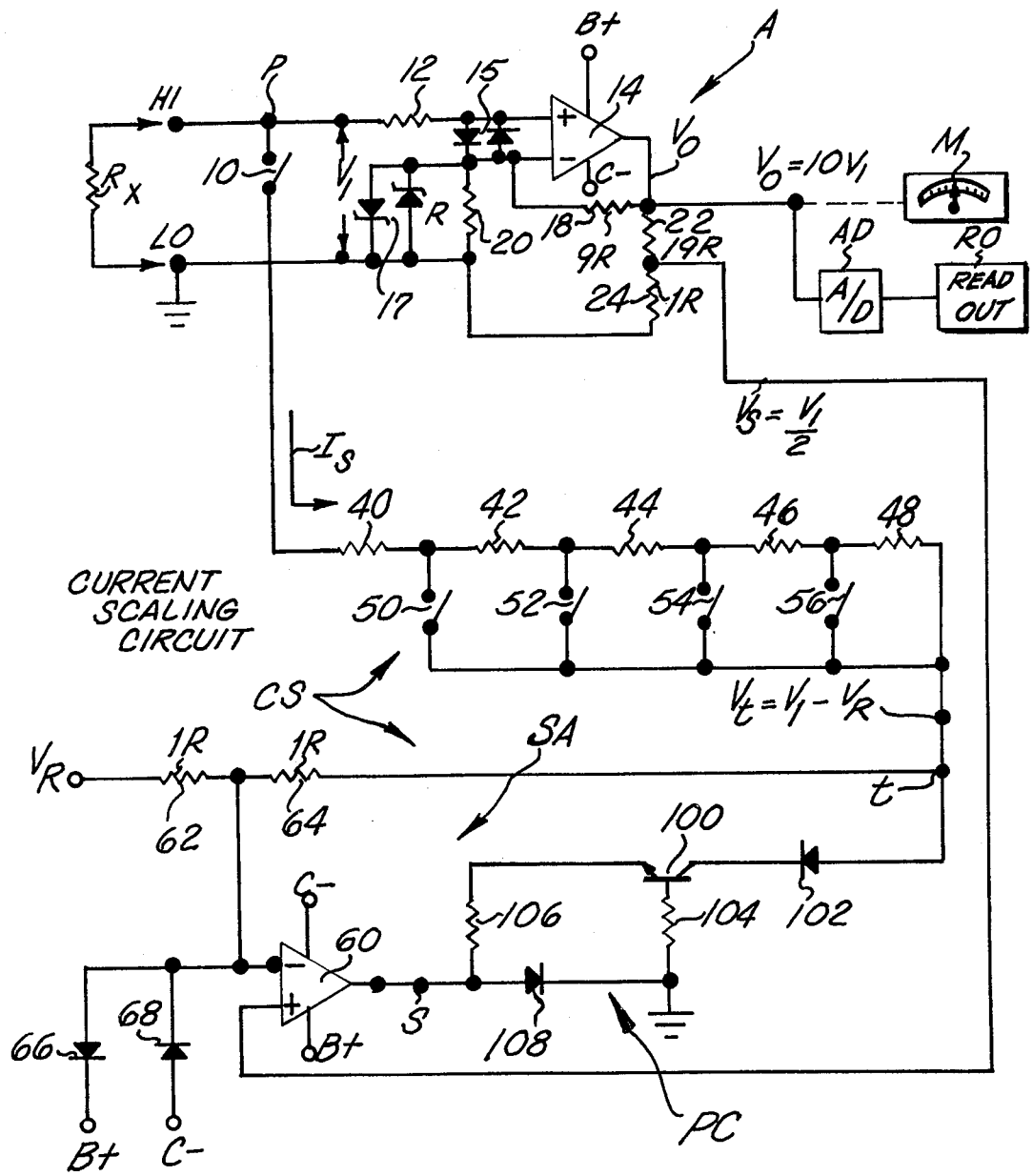
FIG. 1 is a schematic illustration of the invention in conjunction with an ohm measuring circuit.

Referring now to the drawings wherein the showings are for the purposes of illustrating preferred embodiments of the invention only and not for purposes of limiting same, FIG. 1 schematically illustrates a circuit for measuring the magnitude of an unknown resistor $R_X$. Generally, the measuring circuit includes a constant current source CS which serves to provide a constant current $I_S$, which is applied through the unknown resistor $R_X$ to develop a voltage $V_1$ thereacross. The voltage $V_1$ is then amplified by an amplifier circuit A to develop an amplified output voltage $V_0$ which is then measured, as with a suitable voltmeter M or preferably by means of a digital voltmeter comprised of an analog-to-digital converter AD and a digital readout display RO. Whereas various types of analog-to-digital converters and readout circuits may be employed, one suitable converter is the circuitry shown in the copending U.S. Pat. application Ser. No. 186,006, filed Oct. 4, 1971 and assigned to the same assignee as the present invention.

The measuring circuit illustrated in the upper portion of FIG. 1 may normally be used for measuring the magnitude of an unknown voltage applied across the HI and LO input terminals. However, when the magnitude of an unknown resistor $R_X$ is to be determined the current source CS is connected to the HI input terminal by closure of a suitable switch 10. With the switch closed, the current source serves to provide a constant current $I_S$ which flows through the unknown resistor $R_X$ to develop a voltage $V_1$. This voltage is applied through a large protective resistor 12 to the noninverting input of an operational amplifier 14, protected by diodes 15 and 17, in the amplifying circuit A. The bias for the operational amplifier is obtained from B+ (5 volts) and C− (+12 volts) sources. A feedback circuit is provided for the amplifier and includes a resistor 18 connected from the output circuit to the inverting input circuit of the operational amplifier. The junction of resistor 18 and the inverting input circuit is also connected through a resistor 20 to the grounded LO input terminal. Preferably, resistor 18 has a magnitude on the order of 9 times the value of resistor 20 so that the closed loop gain of the amplifier is on the order of 10. Consequently, the output voltage $V_0$ is essentially equal to 10 times the input voltage $V_1$.

A voltage divider is connected between the output circuit of amplifier 14 and ground and includes resistors 22 and 24 connected together in series. Resistor 22 has a resistance which is equal to 19 times that of resistor 24. Consequently, the voltage $V_S$ taken between ground and the junction of resistors 22 and 24 is essentially equal to one-twentieth of the magnitude of the output voltage $V_0$.

The voltage signal $V_S$, taken from the voltage divider comprised of resistors 22 and 24, is applied to a summing amplifier 60 in the current source CS for purposes of adding the input voltage $V_1$ to a reference voltage $V_R$ to obtain a summation voltage $V_T$. This summation voltage is provided at point t in the circuit of FIG. 1. The input voltage present at point P, in FIG. 1, is $V_1$. Consequently, regardless of the level of the input voltage, the voltage between points P and t will be equal to the magnitude of the reference voltage $V_R$. By placing a fixed resistor in series between these two points a known constant current $I_S$ is obtained. Normally, at least a known resistor 40 is connected between points P and t. Resistor 40 may, for example, have a magnitude on the order of 100 ohms. Depending on the magnitude of the input voltage $V_1$ developed across resistor $R_X$, the output measuring circuits may require that a scaling function be performed. It is for this purpose that the constant current $I_S$ may be scaled with the current scaling circuit including resistors 40, 42, 44, 46 and 48 connected together in series. Suitable switches 50, 52, 54 and 56 serve to respectively connect one or more of the resistors in series with resistor 40 to obtain different known levels of the constant cirrent $I_S$. Essentially all of the constant current $I_S$ will flow through the unknown resistor $R_X$, since the input impedance of the operational amplifier 14 is extremely high with respect to the magnitude of any resistor to be placed across the input terminals LO and HI.

The constant current source also includes a summing amplifier SA which serves to provide an output voltage $V_T$ equal to the summation of the input voltage $V_1$ and the reference voltage $V_R$. The summing amplifier includes an operational amplifier 60 having its noninverting input connected to the junction of voltage dividing resistors 22 and 24 so that this input of the amplifier receives voltage signal $V_S$ which, as explained above, is equal to one-twentieth of the output voltage $V_O$. Input voltage protective diodes 66 and 68, poled as shown, respectively limit the inverting input of the operational amplifier to the magnitude of the B+ and C− sources. A reference voltage $V_R$, which may be a positive voltage such as 100 millivolts, is applied to the inverting input of amplifier 60 through a resistor 62. In considering this circuitry we may, for the moment, assume that the output of operational amplifier 60 at point S is short circuited to circuit point $t$. Consequently, the output of the amplifier 60 is connected to the inverting input through a feedback resistor 64. Preferably, resistors 62 and 64 are each of the same magnitude, as indicated by the designation 1R adjacent the respective resistors.

The operation of the summing amplifier may be examined with the use of superposition theory. With this theory, one must consider the amplification of one signal at a time. For example, consider that the input to resistor 62 is grounded. Then, as to input signal $V_S$, the amplifier circuit SA presents a gain of (2) so that the output voltage of the amplifier is equal to twice that of signal $V_S$ or is equal to one-tenth the output voltage $V_O$. Since the output voltage $V_0$ is equal to ten times the input voltage $V_1$, then the output voltage of amplifier 60 is equal to the input voltage $V_1$.

Continuing with the superposition theory, consider that the noninverting input of amplifier 60 is connected to ground so that only the reference signal $V_R$ is amplified. The amplification will be a factor one, due to the equal magnitudes of resistors 62 and 64, but with the signal inverted. Consequently, the output of amplifier will be $-V_R$. Now, considering the summation with both signals $V_S$ and $V_R$ applied to amplifier 60, it is seen that the output voltage $V_T$ is equal to $V_1-V_R$. The total voltage between points P and t will be $V_R$ and, hence, the constant current $I_S$ flows from P to t through the current scaling circuit. Considering the circuit in further detail, it will be noted that the voltage $V_1$ developed across resistor $R_X$ is a negative voltage and, since this negative voltage is applied to the noninverting input of amplifier 14, the output voltage $V_O$ is also a negative voltage.

In the previous discussion, the assumption was made that points S and t are shorted together. Assume now that an overvoltage, in excess of say 5 volts, is applied across the HI and LO input terminals. With the reference $V_R$ being on the order of 100 millivolts, essentially the entire overvoltage would be placed across the calibrated resistor 40. If the overvoltage lasts for any substantial period of time, the power dissipation may be sufficient to destroy resistor 40, on the order of 100 ohms, or at the very least cause sufficient deterioration to vary its resistance value. Consequently, this would adversely effect the operation of the circuitry for measuring the resistance value of an unknown resistor $R_x$. In addition, this overvoltage condition will cause operational amplifier 60 to be driven to saturation. Since the bias for amplifier 60 is taken from a C− source (12 volts) and a B+ source (5 volts), the maximum swing on the output of the amplifier will be substantially below this overvoltage condition. Consequently, the output circuit of the operational amplifier will be driven by the overvoltage condition which may result in destroying the operational amplifier. The overvoltage condition may be protected against by placing a fuse or circuit breaker in the circuit between points P and t or S. However, once a fuse is blown it must be replaced before the circuit will again be operative. Similarly, if a circuit breaker be employed the circuit must be reset before it will again be operative.

In accordance with the present invention, an electronic protective circuit PC is connected in the output circuit of operational amplifier 60 between points S and t to provide protection against such an overvoltage condition. The protective circuit PC employs, in the embodiment illustrated in FIG. 1, an NPN transistor 100 having its collector connected to point t through a diode 102, poled as shown, and its base connected through a resistor 104 to ground. The emitter of the transistor is connected through a resistor 106 to point S. A Zener diode 108, poled as shown, is connected between point S and ground. In the embodiment illustrated, the voltage under normal condition at point t is a negative voltage and transistor 100 is forward biased to saturation so that the current $I_S$ flows through two branches, one consisting of diode 102 and the collector to emitter path and of the transistor, and the other being resistor 64. Zener diode 108, in this embodiment, serves to limit the potential at point S to a specific negative potential. When the bias supply is +5 volts and −12 volts and with the components employed, in one version of the invention, the potential at point S is limited by Zener diode 108 to approximately −3.3 volts. Consequently, the protective circuit does not substantially interfere with the operation of the current source since it effectively places only a resistor 106 between points S and t and this resistor, being within the feedback loop, has a relatively noneffective resistance value, such as on the order of 2 kilohms.

Figure 2:
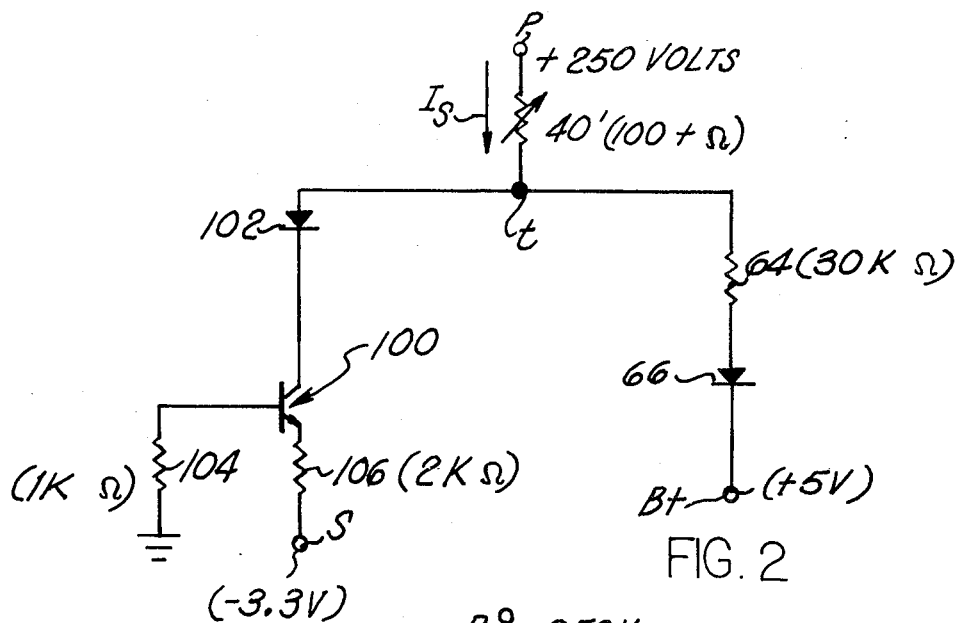
FIG. 2 is a schematic representation illustrating one mode of operation of the protective circuit.

Consider now that an overvoltage has been placed across the HI and LO input terminals. This overvoltage may be extremely high, as on the order of 250 volts. If the overvoltage is a positive 250 volts, then the protective circuitry operates as shown, for example, in the simplified schematic illustration in FIG. 2. Here, the scaling resistor 40 and it companion scaling resistors are illustrated as being merely a variable resistor 40' having a value of 100 ohms, if only resistor 40 is in the circuit. The output circuit of operational amplifier 60 (FIG. 1) is clamped to the maximum potential of −3.3 volts by means of the Zener diode 108. Consequently, point S is clamped to a maximum magnitude of −3.3 volts to protect the operational amplifier. With a positive overvoltage applied, such as plus 250 volts, the protective circuit operates in a current limiting mode to limit current $I_S$ to a low level of, for example, 1.5 milliamperes. This is accomplished since transistor 100 is a high voltage transistor and its base current is substantially less than its emitter current. Hence, the emitter current will be substantially equal to the collector current. The emitter current, with the components shown in FIG. 2, will be on the order of 1.5 milliamperes and, hence, the collector current contributing to current $I_S$, will be limited to a level on the order of 1.5 milliamperes. Current will also flow through the path including resistor 64 and diode 66 on the order of 8.5 milliamperes. Consequently, current $I_S$ will be limited to a level on the order of approximately 10 milliamperes and, at this level, the power dissipation of a 100 ohm resistor, such as resistor 40', is well within its operating characteristics and, hence, the overload condition may exist for a substantial period of time without damage to the calibrated resistor.

Since the current $I_S$ is limited to a low value, on the order of 10 milliamperes, the voltage drop across resistor 40' negligible compared to the overvoltage. Substantially all of the overvoltage is applied across the collector-base circuit of transistor 100. This transistor is a high voltage transistor, such as an RCA 2N3439 silicon NPN transistor which has a collector to base high voltage rating on the order of 450 volts.

Figure 3:
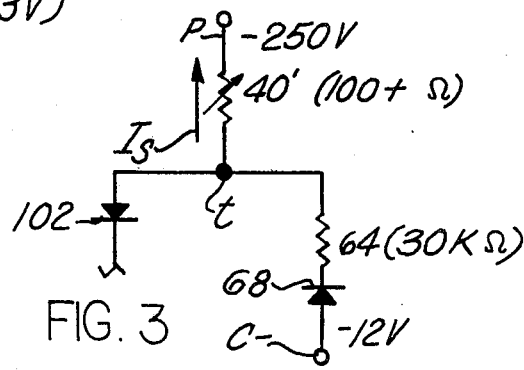
FIG. 3 is a schematic representation showing a second mode of operation of the protective circuit; and, FIG. 4 is a schematic illustration of the protective circuit connected in the output circuit of an operational amplifier for protecting the same against an overvoltage applied to its output circuit.

If the overvoltage condition be a negative voltage, such as −250 volts, then the circuit will operate as shown by the simplified schematic circuit of FIG. 3. Here diode 102 will be back biased and substantially the entire overvoltage will be placed across resistor 64 which is in series with resistor 40'. Resistor 64, which may be on the order of 30 kilohms, is substantially larger than resistor 40' and hence the current $I_S$ is limited to a low level, on the order of 8 milliamperes.

Figure 4:
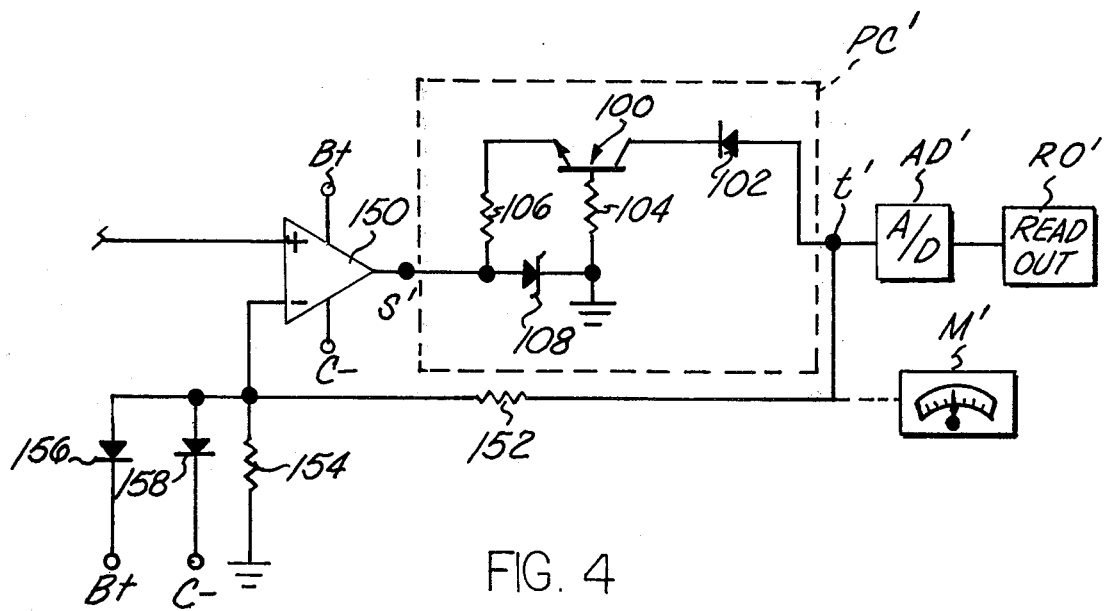

Referring now to FIG. 4, there is illustrated another application of the protective circuit when applied to protecting an operational amplifier from an overvoltage condition applied to its output circuit. In this application the protective circuit PC' is connected between output point S' of an operational amplifier 150 and point t' in the same sense as the protective circuit PC illustrated in FIG. 1. The components illustrated in circuit PC' are identified with the same character references as those in FIG. 1, and the operation thereof is essentially the same as that described hereinbefore. In this embodiment, the output of the operational amplifier is connected to its inverting input through a feedback resistor 152. The junction of the inverting input of the operational amplifier and resistor 152 is connected through another resistor 154 to ground. Protective diodes 156 and 158 connected to B+ and C− voltage sources respectively serve to provide input voltage protection. The input signal to the operational amplifier is applied to its noninverting input. This operational amplifier may be employed for amplifying an unknown input voltage signal representative of the magnitude of an unknown source, such as a resistor, or a voltage source, or a current level, and the output signal is applied to a suitable readout such as an analog-to-digital converter AD' and a readout circuit RO' or a voltmeter M' which may take the same form as circuits AD, RO and M referred to hereinbefore with reference to FIG. 1. The protective circuit PC' operates in the same fashion as described in detail hereinbefore with reference to circuit PC and, hence, no further description is deemed necessary for one skilled in the art. It is to be appreciated, however, in this embodiment the protective circuit PC' serves to protect the operational amplifier 150 from damage due to an overvoltage condition which, through circuit malfunction or through inadvertence, is applied to its output circuit at point t' to destroy the amplifier. Normally, the protective circuit PC' will present only minimum degradation in the output of the amplifier by virtue of the 2 kilohm resistor 106. This, however, is easily compensated for with the feedback network including resistors 152 and 154. In an overvoltage is applied to point t' the current flow will be limited as discussed in detail hereinbelow and the voltage at point S' will be limited to a level of, for example, −3.3 volts. The overvoltage will essentially be placed across the diode or collector to base circuit of the transistor, which, being a high voltage transistor, is capable of withstanding this voltage without damage.

Although the invention has been described with respect to preferred embodiments, it is to be appreciated that the invention is not limited thereto and various modifications may be made without departing from the spirit and scope of the invention as defined by the appended claims.

What is claimed is:

1. An electronic protective circuit for an electrical circuit including an amplifier having an input circuit and an output circuit, said output circuit being connected in a series circuit to an output terminal point, voltage limiting means for limiting the magnitude of the voltage across said input circuit of said amplifier to a given maximum voltage level when an overvoltage is applied to said terminal point, substantially all of said overvoltage being applied between said amplifier input circuit and said terminal point, and current limiting means interposed between said amplifier output and said terminal point for limiting the current flow through said series circuit to a given maximum current level and including semiconductor means having a first current path defined by two electrodes thereof connected in said series circuit between said amplifier output circuit and said terminal point and an impedance connected in said series circuit between said amplifier output circuit and said semiconductor means to thereby limit the current flow through said series circuit.

2. An electronic protective circuit as set forth in claim 1 wherein said semiconductor means includes a third electrode defining a second current path with one of said first and second electrodes which is substantially in parallel with said output circuit, said second current path exhibiting a high impedance relative to said first current path so that said overvoltage is essentially placed across said first current path.

3. An electronic protective circuit for protecting an electrical circuit, having a first portion and a second portion connected in series, from an overvoltage applied across said series connected portions comprising voltage limiting means for limiting the magnetude of the voltage applied to an input of said first portion to a given maximum voltage level, current limiting means connected in series between the output of said first portion and the input of said second portion for limiting the magnitude of current flowing through said series connected circuit portions to a given maximum current level whereby essentially all of a said overvoltage is applied across said current limiting means, said current limiting means including semiconductor means exhibiting the characteristic of withstanding a said overvoltage between first and second electrodes thereof over a range of voltages substantially greater than said given maximum voltage.

4. An electonic protective circuit as set forth in claim 3 wherein said current limiting means includes circuit means for controlling said semiconductor means to limit current flow therethrough to said maximum current level.

5. An electronic protective circuit as set forth in claim 3 wherein said semiconductor means has a third electrode and said first and third electrodes are connected in a series path between said first and second circuit portions, a resistor located in said path between said first portion and said semiconductor so that said resistor limits the magnitude of the current flow therethrough to a value not in excess of said maximum current level.

6. An electronic protective circuit as set forth in claim 3 wherein said first circuit portion includes the output circuit of an amplifier operable to provide an ouput voltage over a given voltage range and connected in series through said current limiting means with said second portion.

7. An electronic protective circuit as set forth in claim 6 wherein said second circuit portion is the output terminal of said amplifier which includes a feedback network connected to said output terminal for amplifying input signals to obtain output voltages at said output circuit within said given voltage range.

8. An electronic protective circuit as set forth in claim 6 wherein said second output portion includes a resistor connected in series with said amplifier output circuit through said current limiting means so that said current flow through said resistor is limited to said maximum current level to thereby protect said resistor from damage due to a said overvoltage applied across said electrical circuit.

9. An electronic protective circuit for an electrical circuit having an input circuit and an output circuit, said output circuit being connected in a series circuit to an output terminal point, a feedback network connecting said input circuit to said output terminal point, said protective circuit being operative to protect said electrical circuit from overvoltages applied to said output terminal point, current limiting means interposed between said output circuit and said output terminal point for limiting the current flow through said series circuit to a given maximum current level whereby essentially all of said overvoltage is applied across said current limiting means, and voltage limiting means connected to said input circuit for limiting the magnitude of the voltage applied to said input circuit through said feedback network.

10. An electronic protective circuit for an electrical circuit having an output circuit, said output circuit being serially connected to an output terminal point, said protective circuit being operative to limit the current and voltage as applied to said output circuit as a result of an overvoltage applied to said output terminal point, an impedance interposed in series between said output circuit and said output terminal point, and a semiconductor having at least two primary electrodes defining a main current path, and a secondary electrode to control said main current path, said main current path being interposed in series between said impedance and said output terminal point, means for applying a fixed voltage level to said secondary electrode whereby the current through said main current path is determined solely by the voltage on said output circuit thereby limiting said current to a given maximum level whereby essentially all of said overvoltage is applied across said two primary electrodes.

11. An electronic protective circuit for an electrical circuit as set forth in claim 10 wherein said semiconductor is a bipolar junction transistor.

12. An electronic protective circuit for an electrical circuit as set forth in claim 10 wherein said secondary electrode is grounded.

13. An electrical protective circuit as set forth in claim 1 wherein said electrical circuit additionally has a feedback network connecting said output terminal point and said input circuit.

* * * * *

UNITED STATES PATENT OFFICE
CERTIFICATE OF CORRECTION

Patent No. 3,979,642　　　　　　　　　Dated September 7, 1976

Inventor(s) Pieter G. Cath and Robert J. Erdman

It is certified that error appears in the above-identified patent and that said Letters Patent are hereby corrected as shown below:

In claim 1, line 11, after "output" please insert --circuit--.

Signed and Sealed this

Thirtieth Day of November 1976

[SEAL]

Attest:

RUTH C. MASON
Attesting Officer

C. MARSHALL DANN
Commissioner of Patents and Trademarks